United States Patent [19]

Brandt et al.

[11] Patent Number: 4,646,004

[45] Date of Patent: Feb. 24, 1987

[54] PHASE-LOCKED SAMPLING OF A PERIODIC SIGNAL

[75] Inventors: Nils Brandt; Anders Karlsson, both of Västerås, Sweden

[73] Assignee: ASEA Aktiebolag, Västerås, Sweden

[21] Appl. No.: 743,928

[22] Filed: Jun. 12, 1985

[30] Foreign Application Priority Data

Jun. 15, 1984 [SE] Sweden .................................. 8403225

[51] Int. Cl.$^4$ ............................................. G01R 23/14
[52] U.S. Cl. ................................ 324/79 R; 324/77 R; 324/78 R; 328/155
[58] Field of Search .............. 331/25; 324/76 R, 77 B, 324/77 C, 77 D, 77 E, 77 G, 78 R, 78 D, 78 Z, 324/79 R, 79 D, 83 R, 83 FE, 83 A, 83 D; 328/155

[56] References Cited

U.S. PATENT DOCUMENTS

| | | | |
|---|---|---|---|
| 3,916,307 | 10/1975 | Hekimian | 324/83 R |
| 3,961,255 | 6/1976 | Hekimian | 324/83 R |
| 3,978,403 | 8/1976 | Mansfield | 324/79 R |
| 4,117,419 | 9/1978 | Rudd | 324/83 FE |
| 4,374,358 | 2/1983 | Hirose | 324/77 B |
| 4,430,611 | 2/1984 | Boland | 324/77 C |

*Primary Examiner*—Michael J. Tokar
*Attorney, Agent, or Firm*—Watson Cole Grindle & Watson

[57] ABSTRACT

A method for phase-locked sampling measurement of a periodically varying quantity. The samples are designated $g(I) \ldots g(I-n)$ and may comprise one complete period or a half of one period. The method involves adapting the sampling frequency and the sample position in relation to the quantity to be measured such that phase locking is attained, and this is done by controlling the time interval between sampling. Whether the sampling frequency needs to be increased, left unchanged or be decreased, depends on a number of decisions depending on the values of samples $g(I)$ and $g(I)-g(I-n)$. A device for carrying out the method is also described.

5 Claims, 4 Drawing Figures

PHASE-LOCKED SAMPLING OF A PERIODIC SIGNAL

BACKGROUND OF THE INVENTION

During sampling measurement of periodic signals, it is often desirable to be able to perform the measurement in a phase-locked manner. When the frequency of the periodic signal varies, as for example the frequency of an a.c. network, it may be difficult to fulfil the demand for phase locking, in which case problems with incorrect measurement and loss of accuracy may arise. The present invention comprises a method of adapting the sampling frequency to the periodicity of the periodic signal, so that phase locking can be maintained even through the frequency $f_m$ of the periodic signal varies.

DISCUSSION OF PRIOR ART

Measuring a quantity u(t) by a sampling technique means that, during each of a series of short periods t, spaced apart at certain intervals $T_s$, an instantaneous measurement is made of the amplitude of the quantity. The time interval $T_s$ defines the sampling frequency $f_s = 1/T_s$ and this known method is illustrated in FIG. 1 of the accompanying drawings.

The sampled values measured at the intervals $T_s$ can be analog signals or digital values. To get an indication of the variations (e.g. the mean value, the R.M.S. value, or the like) of u(t), some form of filtering or processing is needed. In the digital case, certain calculations or other logical operations of different kinds can be conducted during the non-measuring period $(T_s - t)$ of each sampling interval.

The choice of the sampling frequency used is usually determined by factors such as how long a filtering and/or calculating time is needed, how rapidly the magnitude of the quantity being measured may be expected to change or what accuracy of measurement is desired.

The sampling frequency $f_s$ and the measurement periods t can be controlled by a frequency obtained from an oscillator (e.g. by dividing the oscillator frequency). This oscillator may, for example, be the clock oscillator of a computer. Sometimes very high demands are placed on the accuracy of the sampling frequency, for example if a sampling measurement is to be carried out on a periodically varying quantity u(t) and in most cases it is desirable to make periodically recurrent measurements at the same phase position. For such a measurement to take place, the sampling frequency $f_s$ has to be such that it constitutes a certain integral multiple of the frequency $f_m$ of the quantity u(t) to be measured.

If the sampling frequency $f_s$ is constant, accurate synchronization over an extended period of time is impossible to achieve, unless there is a high degree of stability in the frequency $f_m$ over such an extended period.

The prior art method for achieving phase locking is normally based on detections of zero magnitude of the quantity u(t) to be measured, that is by determining when each cyclic period of the quantity starts or ends. The sampling is then initiated by each zero detection. This method is, however, not particularly satisfactory, primarily due to time constants and other inertia in the systems subjected to measurement.

SUMMARY OF THE INVENTION

The invention consists of a method which automatically adjusts the sampling frequency $f_s$ and the sample position relative to the frequency of the quantity u(t) to be measured, thus obtaining a form of phase locking. This is achieved by controlling the time between the samples so that the sampling frequency is continuously adapted to a multiple of the quantity to be measured. The method of the invention is applicable to sinusoidal or other types of periodic signals.

The invention also embraces a device for carrying out the method outlined above.

BRIEF DESCRIPTION OF THE DRAWINGS

The invention will now be described in greater detail, by way of example, with reference to the accompanying drawings, wherein.

DESCRIPTION OF THE PREFERRED METHOD

Figure 1:
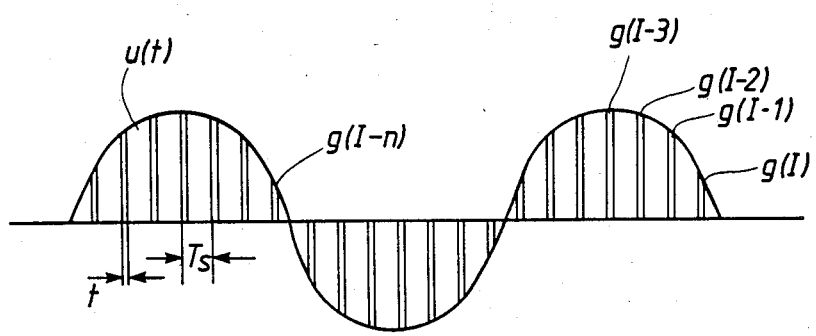
FIG. 1 shows a quantity u(t) periodically varying with a frequency $f_m$, and indicates at what times, or phase positions, spaced apart by a sample time $T_s$ sampling can be carried out over measurement times t.

A method according to the invention presupposes access to an adequate memory capacity, which can be rapidly read and updated, and certain logic units in which logical and comparative operations can be carried out.

Memories, units for calculation and other processing, such as comparison etc., can be carried out, as mentioned, in a pure analog technique, a pure digital technique, or in a hybrid analog digital technique. However, the following description will concentrate on a digital technique, since a preferred embodiment of a device for carrying out the method is, with the present state of the art, based on digital technique, for example by using microprocessors.

The sampled and stored values used in the method to be described consist of digital information and are designated g(I), g(I−1) . . . and so on up to g(I−n). By processes, which will be described hereafter, the value of a sample at the end of a period, that is g(I), and the value of a sample at the end of the preceding period, that is g(I−n), are determined in order that these values can be subjected later on to the special processing, which forms the basis of this invention.

The method for finding a sample located at one end of a cyclic period of the quantity to be measured can be carried out as follows: Let it be assumed that it is desired to find a sample g(I) in the vicinity of a zero passage for u(t) when the quantity u(t) has a negative rate of change of magnitude. By continuously monitoring the difference between two consecutive samples, it is possible to identify that sample where the rate of change of u(t) changes its sign from having a positive value to having a negative value. In this way, information is given that the next sample will be measured on that flank of the quantity u(t) which has a negative rate of change. This means that u(t), after a period of time, normally corresponding to a quarter of one period, will exhibit another zero passage, this time with the quantity u(t) passing from a positive to a negative value. With knowledge of the desired quotient $f_s/f_m$, that sample which arrives about one quarter of a period of $f_m$ later can be predicted, which corresponds to the time when u(t) has its first zero passage. This value is now defined as g(I), whereby the value of g(I−n), that is, the value of the sample which is obtained during the preceding zero passage when u(t) has a negative rate of change, is also defined.

The method according to the invention comprises, on the one hand, finding out whether g(I) 0 and, on the other hand, comparing or forming the difference between the values of g(I) and g(I−n). Depending on the result of the comparison, the sampling frequency is modified in such a way that a phase locking of the measurement at a zero passage can be achieved and then maintained. A flow chart of the comparisons made and the measures to be taken to carry out the method of the invention can be deduced from FIG. 2.

Briefly, and expressed in Boolean algebra, if measurements are to be performed over one complete period and a negative rate of change for u(t) is the starting-point, the time between the samples needs to be increased if:

$$[g(I)>0]\cdot[g(I)-g(I-n)\geq 0]+[g(I)=0]\cdot[g(I)--g(I-n)>0]$$

The time between the samples needs to be reduced if $$[g(I)>0]\cdot[g(I)-g(I-n)\leq 0]+[g(I)=0]\cdot[g(I)-n)<0]$$

whereas no action need be taken to alter the time between the samples if $$[g(I)=0]\cdot[g(I)-g(I-n)=0]+[g(I)>0]\cdot[g(I)--g(I-n)<0]+[g(I)<0]\cdot[g(I)-g(I-n)>0]$$

The conditions for taking a corrective action can also be summarized in tabular form according to the following Table 1:

TABLE 1

| g(I) | $\Delta g(I)$ g(I)-g(I −n) (∼1 period) | | |
|---|---|---|---|
| | >0 | =0 | <0 |
| g(I) > 0 | 1 Increase time between samples | 2 Increase time between samples | 3 No change required |
| g(I) = 0 | 4 Increase time between samples | 5 No change required | 6 Reduce time between samples |
| g(I) < 0 | 7 No change required | 8 Reduce time between samples | 9 Reduce time between samples |

If the conditions for taking corrective action are, instead, expressed on the basis of the sampling frequency, the rule generally applies that if the time between the samples increases, this corresponds to a reduction of the sample frequency and vice-versa. This is clear, among other things, from the following claim 1, where the conditions for measures to be taken have been worded starting from the sampling frequency.

Figure 3:
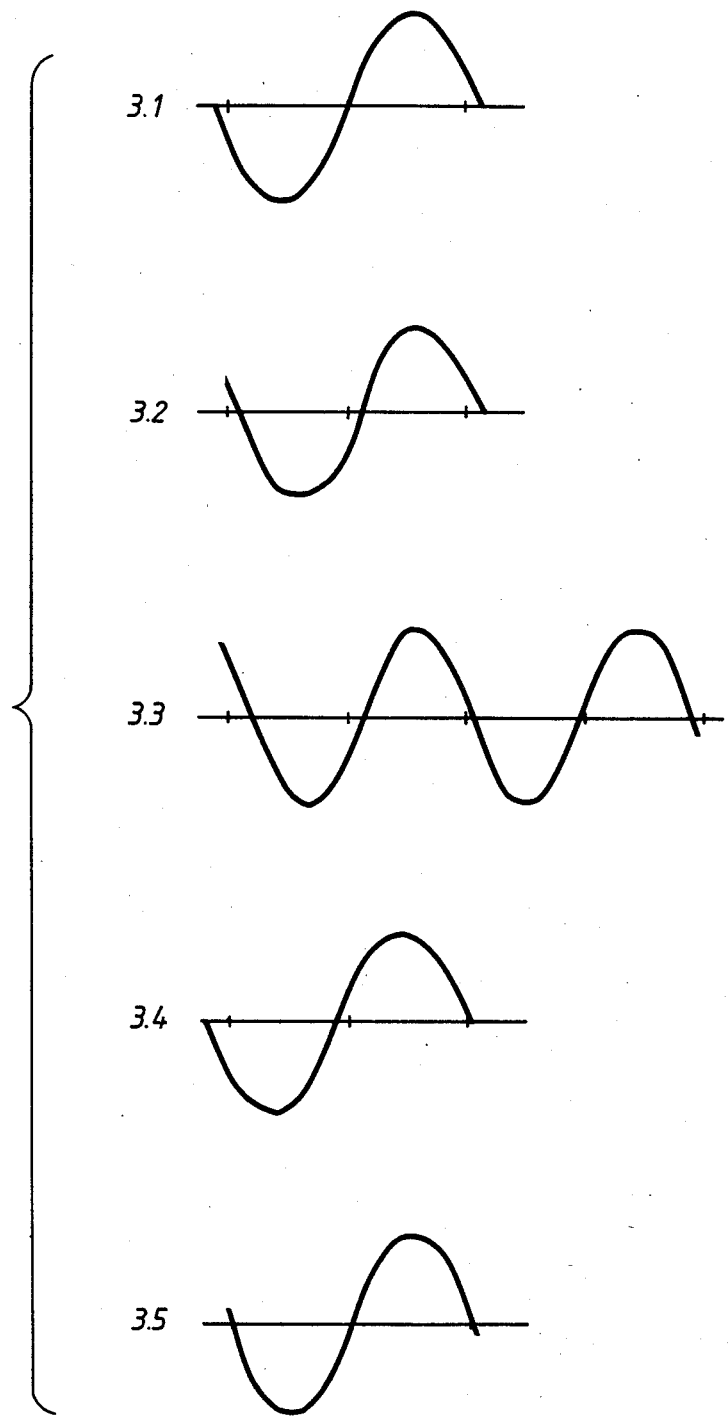
FIG. 3 illustrates nine sampling measurements on a sinusoidal signal in accordance with the alternatives illustrated in the flow chart of FIG. 2 and the following Table 1.
Figure 3:
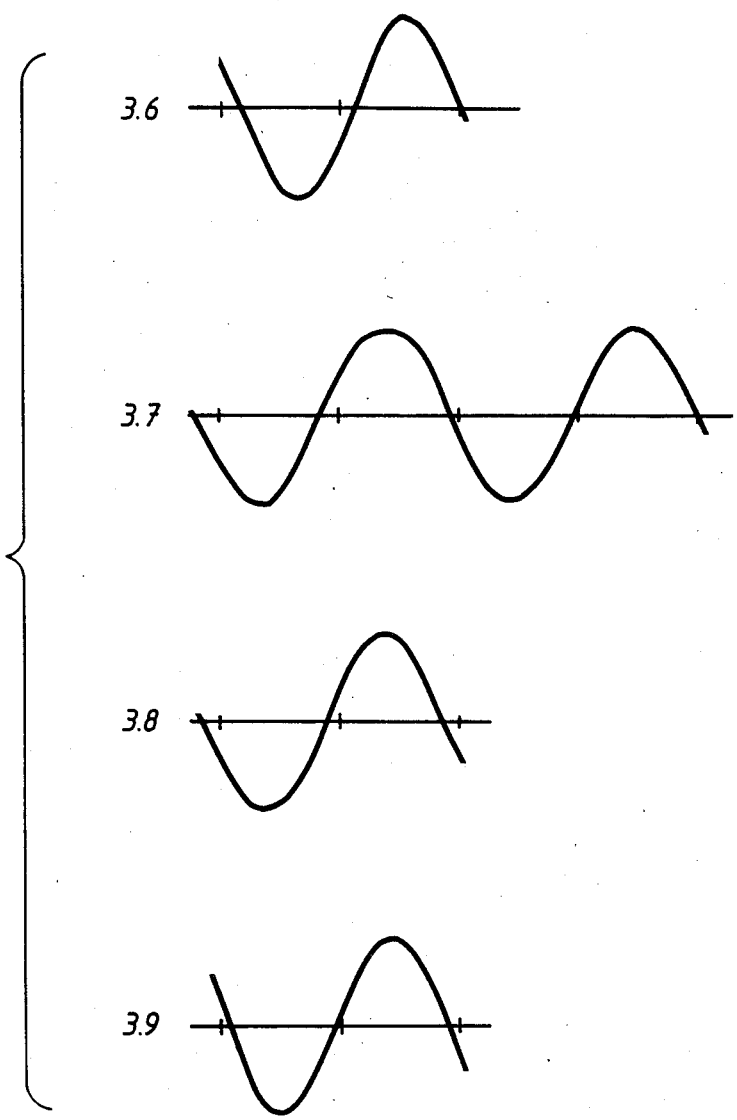

FIG. 3 illustrates nine conditions of measurement indicated as 3.1–3.9, the decimal points corresponding to the numbers used in Table 1.

3.1 of FIG. 3 illustrates a measurement situation where the sample g(I) is positive and where the difference between samples g(I) and g(I−n) is also positive.

In this case, it is necessary to increase the time interval between the samplings in order to obtain a sample as close to the zero passage point as possible. After a certain increase of the time between the samplings, the same sign conditions can be used again during the next measurement. This means that the time between the samplings will be further increased. Subsequently, some of the sign conditions will be changed, possibly so that g(I) or g(I)−g(I−n) becomes zero, which means that the time interval between the samplings may have to be reduced, or alternatively, that the time intervals between the samplings do not need to be changed.

3.5 of FIG. 3 corresponds to the situaton whre both g(I) and g(I)−g(I−n) are zero, that is, the state towards which the system will work after having been exposed to a disturbance of some kind.

A method according to the invention is general in such a way that a zero passage from a negative to to a positive value, that is, with a positive sign of the rate of change at the zero passage, can also be used for identifying the phase locking. The conditions for taking measures must then, of course, be adapted to the new conditions.

In a further method according to the invention, g(I−n) may correspond to the sample taken half a period before the sample g(I). The conditions for taking measurments according to this method will be clear from Table 2:

TABLE 2

| g(I) | $\Delta g(I)$ g(I)-g(I − n) (∼½ period) | | |
|---|---|---|---|
| | >0 | =0 | <0 |
| g(I) > 0 | No change required | Increase time between samples | Increase time between samples |
| g(I) = 0 | Reduce time between samples | No change required | Increase time between samples |
| g(I) < 0 | Reduce time between samples | Reduce time between samples | No change required |

The time interval between two samples consists of a certain number of cycles of the frequency of the oscillator in question. A change of the sampling frequency means that this number is reduced or increased by a fixed number of cycles. The magnitude of the change determines the performance of the method in such a way that a change by a small amount results in a high accuracy but in reduced conformity to rapid variations of $f_m$ and vice versa.

Figure 4:
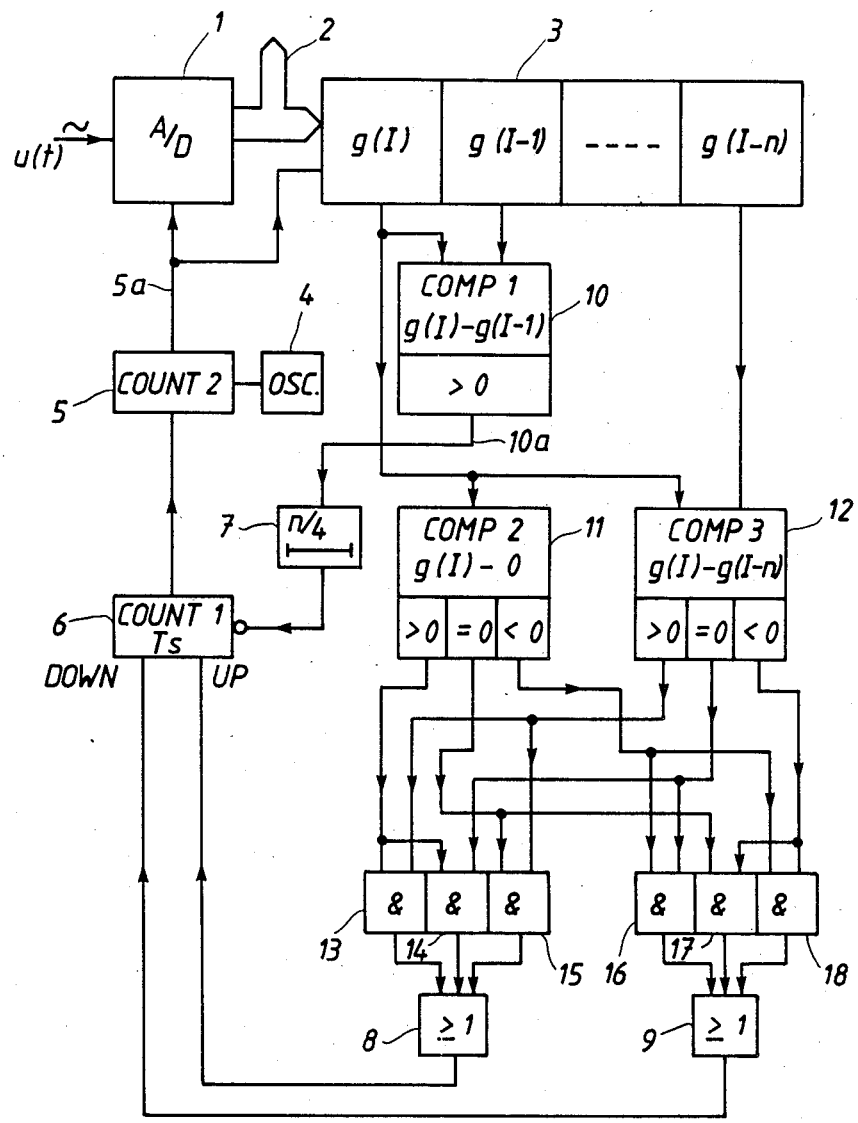
FIG. 4 is a block diagram of one device by which the method of the invention can be carried out.

A device for carrying out the method is illustrated in FIG. 4. The periodically varying quantity u(t) to be sampled is supplied to an A/D convertor 1. The sampled measured values are led in digital form, via a databus 2, to the member or members which is or are to make use of the sampled values, as well as to the device which accomplishes phase-locked sampling according to the method of this invention.

The sampled measured values are supplied to a memory register 3, in which each measured new sample is stored in the memory together with the previously stored samples, in such a way that the last n+1 samples are always available in the shift register.

The device also includes an oscillator 4. Depending on the frequency of the oscillator and the desired number of samples to be taken each period of u(t), it is determined how many cycles of the oscillator 4 are needed to make up the time interval $T_s$.

A counter 5 counts the number of clock pulses from the oscillator 4 until a reference value corresponding to the time interval $T_s$ is achieved. Thereafter the counter 5 is set to zero and a pulse is delivered on a line 5a to the A/D converter 1 and to the shift register 3. A reference value corresponding to the time $T_s$ is obtained from a count-up/count-down counter 6. The contents of the counter 6 can be changed by at most one integer when, and only when, a downward flank of n(t) is obtained from a time delay element 7. Whether the counter 6 counts up one integer, remains unchanged, or counts down one integer is determined by two gates 8 and 9. The output signals from these gates 8 and 9 are thus used to maintain phase locking.

The method for locating a sample which lies in the vicinity of the zero passage of the periodically varying quantity u(t) has been described, in principle, earlier. That part of the device according to the invention which executes the location of such a sample can be constructed as is shown in FIG. 4.

The value of the latest sample g(I) and the sample g(I−1) immediately before that sample in the shift register 3 is passed to a first comparator 10, which continuously compares g(I) and g(I−1) by forming the difference g(I)−g(I−1). As long as the difference is greater than zero (which implies that that part of the time curve of the periodically varying quantity has a positive rate of change), a logic "one" is obtained on the output 10a of the comparator 10. When the difference becomes zero or changes sign, that is, when measurement is made on the peak value of the quantity or that part of the time curve of the quantity which has a negative rate of change, the output of the first comparator will be a logic "zero". This means that a signal change is obtained when approximately one quarter of a period of the periodically varying quantity remains. Starting from n samples per period the signal change is allowed to be passed, via the time delay element 7, to the counter 6 after a time which corresponds to n/4 samples later.

DESCRIPTION OF PREFERRED DEVICE

Figure 2:
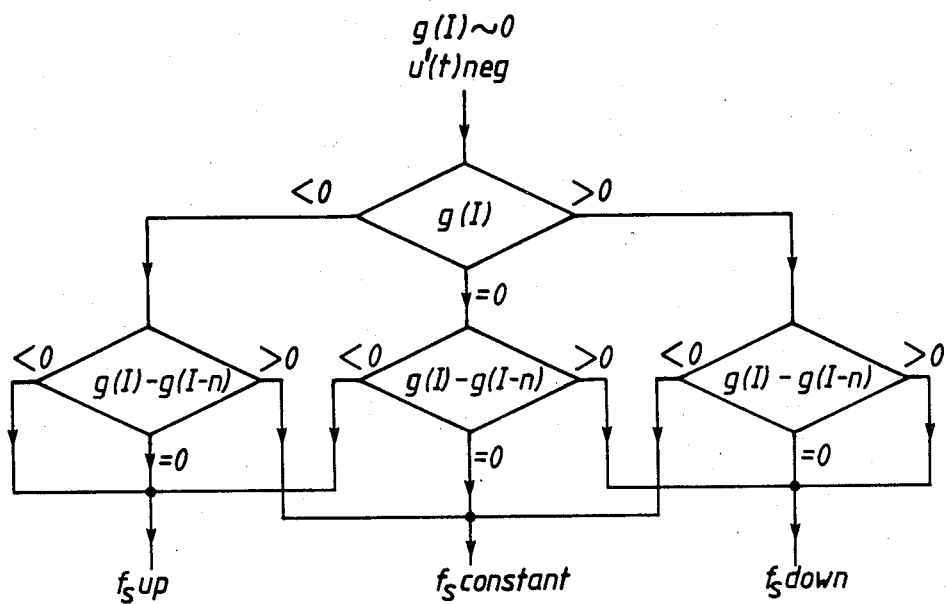
FIG. 2 is a flow chart illustrating how a method according to the invention can be effected.

An embodiment of a device for carrying out the phase locking method according to the flow chart in FIG. 2 can be constructed as is shown in the remaining part of FIG. 4. This includes a second comparator 11 and a third comparator 12 as well as a number of AND-elements 13 to 18 and two OR-elements forming the gates 8 and 9.

In addition to being passed to the above-mentioned first comparator 10, the sample g(I) is passed also to the second comparator 11 and to the third comparator 12. The sample g(I−n) is also passed to the third comparator 12.

In the second comparator 11 the difference g(I)−0 is formed. Depending on whether this difference is greater than, smaller than or equal to zero, a logic "one" is passed from the output of the comparator to two of the AND-elements 13, 14, 15, 16, 17, 18.

In the third comparator 12 the difference g(I)-g(I−n) is formed, and in a similar way a logic "one" is passed to two of the AND-elements 13, 14, 15, 16, 17, 18, depending on whether this difference is greater than, smaller than, or equal to zero.

When the input signals of the AND-elements cooperate in accordance with the Boolean conditions previously described, an input signal is fed to the OR-element 8 when the time $T_s$ between the samples has to be increased, and an input signal is fed to the OR-element 9 when the time $T_s$ has to be decreased. As previously stated, the output signals from the OR-elements 8, 9, are passed to the respective inputs of the reference counter 6 to increase or decrease the number of cycles of the oscillator frequency which occur between the taking of each sample, so as to obtain effective phase locking.

The device described with reference to FIG. 4 illustrates a preferred embodiment of the invention. In the same way as the realization of logical conditions in general can be performed in many known ways using current techniques, the phase-locking method according to this invention can be solved from a purely technical point of view in a number of different ways by the use of analog and/or hybrid analog/digital techniques to a greater or lesser extent.

We claim:

1. A method for phase-locked sampling during measurement of a periodically varying quantity u(t) with a nominal frequency $f_m$, the sampling being intended to take place n times per period with a sampling frequency of $f_s = n \cdot f_m$, the last n+1 measured sampled digital values g(I), g(I−1) ... g(I−n) being stored in a shift register, the method being characterized in that the sampling frequency $f_s$ is varied around $f_s = n \cdot f_m$ so that it will be adapted to the periodicity of the quantity to be measured in such a way that phase-locked sampling is obtained, the adaptation being based on the result of a comparison of the sampled data of g(I) and g(I−n) according to the following:

the sampling frequency is increased if g(I) is $\leq 0$ and g(I)−g(I−n) is $\leq 0$, provided that g(I) and g(I)−g(I−n) are not both =0, and the sampling frequency is reduced if g(I) is $\geq 0$ and g(I)−g(I−n) is $\geq 0$, provided that g(I) and g(I)−g(I−n) are not both =0, and the sampling frequency is retained unchanged if any one of the following conditions is met both g(I) and g(I)−g(I−n) are zero, g(I) is positive and g(I)−g(I−n) is negative, and g(I) is negative and g(I)−g(I−n) is positive.

2. A method according to claim 1, in which the difference between the value of a sample and the value of the preceding sample is determined.

the sign of the difference is determined, and the value of the sample, which is measured n/4 samples after the sample when the sign of the difference changes from plus to minus, is identified as g(I).

3. A method according to claim 1, in which the value of that sample which lies n samples before the value of that sample which is identified as g(I), is identified as the value of the sample g(I−n).

4. A method according to claim 2, in which the value of that sample which lies n samples before the value of that sample which is identified as g(I), is identified as the value of the sample g(I−n).

5. A device for carrying out the method according to claim 1 for phase-locked sampling during measurement of a periodically varying quantity n(t) with a nominal frequency $f_m$, comprises an A/D converter, a databus, a shift register having a plurality of memory addresses, an oscillator, a first and second counter, a time delay element, a first and a second OR-element, a first, a second and a third comparator and a plurality of AND-elements, the device being characterized in that sampled digital data from the A/D converter are supplied to the memory addresses of the shift register via the databus, a sampling frequency for control of the shift register is supplied to the shift register, from the first two memory addresses of the shift register sampled digital data is supplied to the first comparator, the output of which, via the time delay element, is supplied to the first counter, the output signal of the first counter is supplied to the second counter, the second counter is supplied with a signal from the oscillator, the output signal of the second counter is supplied to the A/D convertor and the shift register, digital data from the first memory of the shift register is supplied to the second comparator and to the third comparator, to said third comparator there are also supplied digital data from the last memory address of the shift register, the output signals of the second and third comparators are supplied to a first, a second, a third, a fourth, a fifth and a sixth AND-element, the output signals from the first, second and third AND-elements being supplied to the first OR-element, the output signal of which is supplied to the first counter, and the output signal from the fourth, fifth and sixth AND-elements are supplied to the second OR-element, the output signal of which is supplied to the first counter.

* * * * *